MOTOR TUNING SYSTEM FOR RECEIVING SYSTEMS

Filed Feb. 13, 1947 2 Sheets-Sheet 1

Inventor:
Nelson P. Case,
By Christen, Schroeder, Merriam & Hofgren,
Attys.

MOTOR TUNING SYSTEM FOR RECEIVING SYSTEMS

Filed Feb. 13, 1947

2 Sheets-Sheet 2

Inventor:
Nelson P. Case,
By Christen, Schroeder, Merriam & Hofgren,
Attys.

Patented Nov. 14, 1950

2,529,677

UNITED STATES PATENT OFFICE 2,529,677

MOTOR TUNING SYSTEM FOR RECEIVING SYSTEMS

Nelson P. Case, Oak Park, Ill., assignor to The Hallicrafters Co.

Application February 13, 1947, Serial No. 728,317

17 Claims. (Cl. 250—40)

Figure 1:
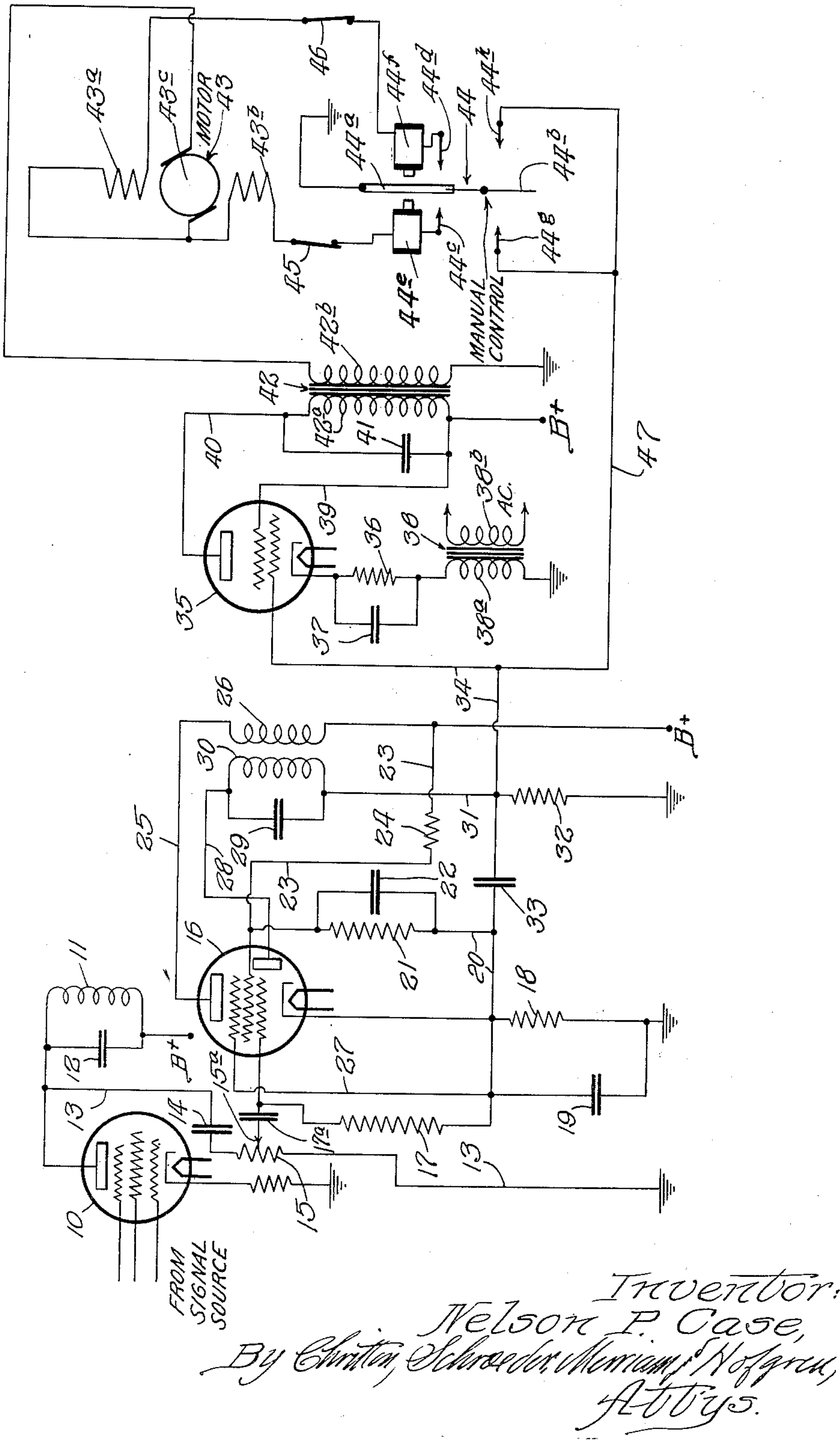

This invention relates to an automatic tuning system, and more particularly to a motor driven automatic tuning system.

Automatic tuning is a desirable feature of a receiving system, and in the past many automatic tuning systems have been developed. Most of these systems are of the so called "push button" type, wherein there is a separate push button for every station which may be automatically tuned. In this type of system when a button is pushed the tuning means of the receiver are driven to a position where the receiver will be tuned to the desired station. Both the drive and the control for the drive are usually mechanical, and the automatic tuning system is, therefore, subject to any mechanical inaccuracies in the control. Other disadvantages of this type of automatic tuning system are that stations have to be selected and set up individually with a push button for each station. In the event that the location of the receiver is changed or in the event it is desired to include a new station in the automatic tuning system, it is necessary to reset the tuning system, and the number of stations which may be automatically tuned is limited by the practical consideration that too many push buttons are undesirable. Furthermore, in the event that the frequency of one or more of the desired stations is changed it is necessary to reset the automatic tuning.

These disadvantages are particularly applicable to mobile receiving units, as for example, a radio receiver located in an automobile. If during the course of a trip the receiver is moved out of the range of the local stations and into the range of new stations on different frequencies the automatic tuning system is incapable of accommodating itself to the new frequencies and the system must be reset. In many cases this is a task which cannot be performed by an unskilled person, thereby causing inconvenience, delay and expense to the operator of the radio receiver.

I have developed and am herein disclosing and claiming an improved automatic tuning system for receiving systems, including motor means adapted to vary the tuning means, and wherein the motor is electronically rather than mechanically controlled. My improved system includes only one control arrangement which need be changed in normal operation (which arrangement may comprise a single double-throw switch or its equivalent in the form of two push buttons or other single-throw switches) although, of course, there may be other controls on my tuning system. However, these other controls are either automatically operated or are preset, so that there is only a single control arrangement which is utilized in the operation of the system over a complete tuning range as opposed to the multiple push buttons of the conventional automatic tuning arrangement wherein there is one push button for every station under the control of the system.

Other advantages of my improved tuning system are that it may be tuned in either direction at will; that fading of the signal will not cause the tuning to change; that stations do not have to be selected and set up individually; that the device does not interfere in any way with manual tuning of the receiver; and that my system automatically accommodates itself to changes in station frequency or to the appearance of new stations within the tuning range, and the system does not require resetting with a change in location of the receiver. With my improved system the number of stations which may be automatically tuned while using only one control arrangement depends only on the availability of signals and the sensitivity of the receiver, and my improved system may be adapted for remote control, if desired.

Figure 2:
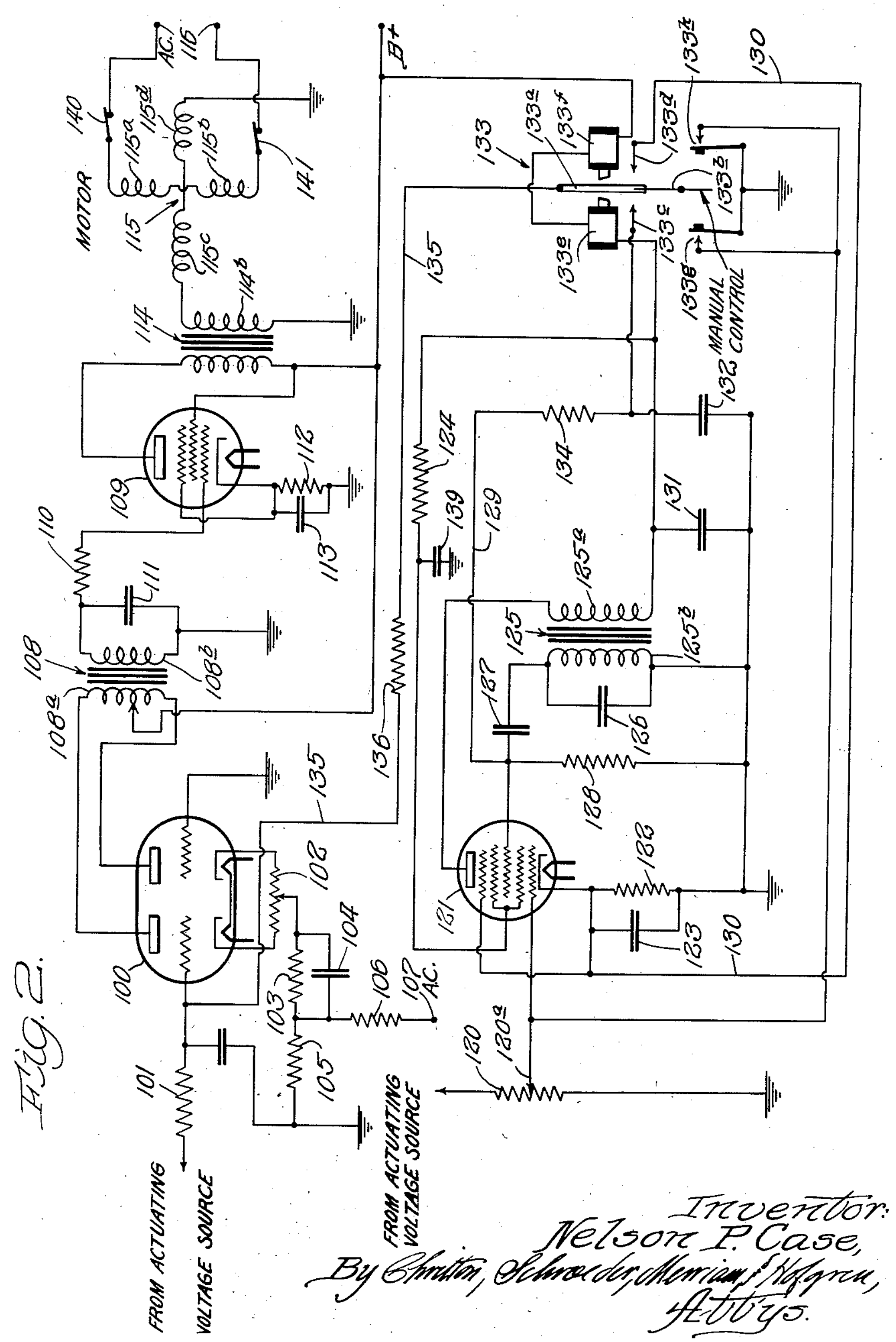

Other features and advantages of my improved automatic tuning system will be apparent from the following specification and from the drawings, in which:

Figure 1 is a schematic diagram of an automatic tuning system comprising one embodiment of my inventions; and Figure 2 is a schematic diagram of an automatic tuning system comprising another embodiment of my inventions and illustrated in a receiver having automatic frequency control.

Referring now to the drawings, Figure 1 illustrates my invention as incorporated in a conventional amplitude modulation receiver having means for developing an actuating voltage with characteristics which vary as a function of the tuning with respect to a received signal. In the circuit shown in Figure 1 the actuating voltage varies in frequency as a function of said tuning, and may comprise, for example, a portion of the output voltage from the intermediate frequency amplifier. This actuating voltage is utilized to energize an electronic device in such manner that the output voltage of such device includes a component of the same frequency as the actuating voltage. This frequency component is used to control the operation of a high-Q pretuned circuit which is resonant at the intermediate frequency of the receiver. As will be apparent to those skilled in the art, the high ratio of reactance to resistance in the tuned circuit renders this circuit receptive to only a very narrow band of frequencies adjacent the resonant frequency of said circuit. Delayed detecting means associated with said tuned circuit develop, as a function of the frequency of said actuating voltage, a direct current control voltage which is utilized to control another electronic device. A motor which is adapted to vary the tuning means of the receiver is included in a circuit with normally open switch means, and the last mentioned electronic device is adapted to control a motor energizing voltage in this circuit and to hold the switch means closed. Therefore, when the control voltage is applied to the last mentioned electronic device to cut off current flow therethrough, the energizing voltage for the motor is removed and the switch means are caused to open. However, when the control voltage is rendered ineffective or is removed and the normally open switch means are manually closed, the arrangement is such that motor energizing current flows through the second electronic device, and such device also holds the switch means closed until the control voltage is again applied.

In Figure 1, 10 represents the last intermediate frequency amplifier tube of a conventional superheterodyne radio receiver, such tube having at least cathode, plate and grid elements and being of any conventional tube type adapted for use as an intermediate frequency amplifier, as for example, tube type No. 6SG7. The plate or output circuit of such tube includes a conventional tuned circuit comprising an inductance 11 and a condenser 12, such circuit being tuned to the intermediate frequency of the receiver. The balance of such conventional superheterodyne receiver is not illustrated in the drawing and will not be explained here, since such receivers are well known in the art.

A portion of the output voltage from the tube 10 is connected to ground through the lead 13 which incorporates the D. C. blocking condenser 14 and the resistance 15, such resistance preferably being variable and being illustrated in Figure 1 as a potentiometer having a movable tap 15*a*. A limiter tube 16, which may be a diode pentode and may be tube type No. 6SF7 containing cathode, grid and plate elements, is shown with the control grid connected through the condenser 17*a* to the movable tap 15*a* on the potentiometer, the control grid circuit for this tube being completed by means of the grid leak resistor 17 which is connected to the cathode. The cathode of the tube is connected to ground through the cathode resistor 18 which is bypassed by the condenser 19 in the conventional manner, and the cathode may also be connected to the source of B plus voltage to provide delayed detection as hereafter described. This latter connection is made through lead 20, the voltage dropping resistor 21 (which is bypassed by the condenser 22), and the lead 23 which includes the voltage dropping resistor 24. The plate of this tube is connected to the B plus voltage by means of the lead 25 which incorporates the plate load inductance 26, and the screen grid is also connected to said source of B plus voltage by means of the lead 23, while the suppressor grid is connected to the cathode by means of the lead 27.

Such tube includes a diode anode which is adapted to cooperate with the cathode of the tube, and which is connected by means of the lead 28 to the tuned circuit comprising a condenser 29 and an inductance 30 connected in parallel, such inductance being inductively coupled to the inductance 26 in the pentode plate circuit of the tube. The lower end (in the drawings) of the tuned circuit is connected to ground by means of the lead 31 which incorporates the resistor 32, and a high frequency bypass return to the cathode is provided through the condenser 33. Obviously if desired, a separate diode may be used rather than the arrangement shown here.

The upper or high-potential end of the resistor 32 is directly connected by means of the lead 34 to the control grid of a power tube 35 which may be tube type No. 6V6–GT and includes cathode, grid and plate elements. The cathode circuit of this tube includes the resistor 36 bypassed by the condenser 37, and the secondary 38*a* of an audio frequency transformer 38, the lower end of said secondary being connected to ground. The primary 38*b* of this transformer is adapted to be connected to a source of power as for example a conventional 60 cycle alternating current voltage source. The screen grid of this tube is connected to the B plus supply through the lead 39, and the plate of the tube is connected to said B plus supply by means of the lead 40 which incorporates the parallel tuned circuit including the condenser 41 and the primary 42*a* of the audio transformer 42.

A reversible motor 43 having oppositely wound field coils 43*a* and 43*b* and an armature 43*c* is included in a circuit which is coupled to the plate circuit of the power tube by means of the secondary 42*b* of the transformer 42, the lower end of said secondary being connected to ground and the upper end being connected to the armature 43*c* of the motor. The other side of the armature is connecetd to the common junction of the two field coils 43*a* and 43*b*.

A normally open switch indicated generally at 44 includes a grounded movable manual control member comprising the element 44*a* of magnetic material, this element having a manually operable flexible extension 44*b* of electrically conducting material, as for example spring steel. The movable switch member is adapted to be manually operated to cause the element 44*a* to move into electrical contact with either of the contacts 44*c* or 44*d*, such member being biased by a spring or other means to normally return to open position as shown in the drawings, but being adapted to be held against the contact 44*c* by means of the solenoid 44*e*, and similarly to be held against the contact 44*d* by means of the solenoid 44*f*. However, as may be clearly seen in the drawing, when the element 44*a* is moved against one of the contacts 44*c* or 44*d*, the flexible element 44*b* is still open, and in order to make this element contact either of the respective contacts 44*g* or 44*h* it is necessary to exert additional manual pressure against the element 44*b* to cause it to bend or flex. As soon as the manual pressure holding the element 44*b* against either of its cooperative contacts is removed, the spring tension inherent in such member will cause it to move away from its cooperating contact whether or not either of the solenoids 44*e* or 44*f* is energized.

The field coil 43*b* is connected to the contact 44*c* through the solenoid 44*e* and the limit switch 45 which is mechanically arranged to open when the tuning means reaches the end of its travel in one direction. Similarly the field coil 43*a* is connected to the contact 44*d* through the solenoid 44f and the limit switch 46, which limit switch is mechanically arranged to open when the tuning means reaches the end of its travel in the opposite direction. The contacts 44g and 44h, which are adapted to cooperate with the flexible element 44b, are connected together and both are connected to the grid of the power tube through the leads 47 and 34. Consequently, whenever the member 44b is moved against either of the contacts 44g or 44h, the grid of the power tube is grounded.

In the event that the movable element of the switch 44 is manually moved so that the magnetic portion 44a comes into physical engagement with one of its cooperating contacts, as for example 44c, and the movable flexible extension 44b is manually flexed or bent beyond the position where it merely holds switch elements 44c and 44a closed and until it physically engages one of its cooperating contacts, as for example 44g, the control grid of the power tube 35 will be grounded through the leads 34 and 47 and through the movable element of the switch 44, and any negative bias voltage which was applied to such control grid will be shorted to ground, rendering the power tube conductive. The alternating voltage in the primary 38b of the transformer 38 will be impressed upon the cathode circuit of the power tube by means of the secondary 38a of the transformer, and this voltage will be passed through the tube and appear across the transformer primary 42a in the output circuit of such tube. The secondary 42b provides a means for impressing this alternating voltage upon the motor circuit, causing a current to flow through the armature 43c, the field coil 43b, the solenoid 44e, and the switch 44 to ground. The motor will, therefore, run in one direction and the solenoid 44e will become energized and will maintain the movable switch element 44a in physical engagement with the contact 44c. As soon as the manual pressure on the switch is released the element 44b will move out of engagement with the contact 44g to remove the short from the grid of the power tube and leave such grid responsive to a control voltage. The solenoid 44e, however, continues to hold the switch elements 44c and 44a closed.

It will be seen that in the event a D.-C. control voltage of sufficient amplitude to bias the power tube 35 beyond cut-off is impressed upon the control grid of such tube, the motor energizing voltage will be removed, the motor will cease to run, the solenoid 44e will be de-energized, and the movable switch element 44a will be caused to move out of engagement with the contact 44c. Such a control voltage is developed, as a function of the frequency of the actuating voltage, in the circuit including the limiter tube 16 in a manner to be hereafter described.

As explained earlier in this specification, an actuating voltage comprising a portion of the output voltage from the last intermediate frequency amplifier stage of the receiver is developed across the potentiometer 15, and a portion of this actuating voltage is impressed upon the control grid of the limiter tube 16. This actuating voltage varies in frequency as a function of tuning with respect to a received signal. As the difference between the frequency of the local heterodyning oscillator and the frequency of the signal to be received comes within the pass-band of the tuned circuits comprising the IF amplifier, a signal will be passed through the IF amplifier, and this signal will change in frequency so long as the tuning means of the receiver (including the tuning of the local heterodyning oscillator) continue to be varied. Thus as the tuning of the receiver approaches the frequency of the received signal a voltage will be developed across the potentiometer 15, and this voltage will constantly change in frequency to approach the intermediate frequency of the receiver. This actuating voltage controls the pentode section of the limiter tube 16, and an amplified voltage equal in frequency to the actuating voltage is developed across the inductance 26. By virtue of the limiting action of tube 16, the amplitude of the developed voltage is substantially constant for all signals above a threshold level determined by the setting of potentiometer 15.

The tuned circuit comprising the condenser 29 and the inductance 30 is coupled to the inductance 26, but since such tuned circuit has a high Q it will be responsive to the voltage across the inductance 26 only when such voltage is of a frequency very nearly equal to the resonant frequency of the tuned circuit. The tuned circuit constants are such that the circuit is resonant at the intermediate frequency of the receiver, and the upper end (as the parts appear in the drawing) of the tuned circuit 29, 30 is connected to the diode anode by means of the lead 28 while its lower end is coupled to the cathode of the limiter tube 16 through the high-frequency bypass condenser 33. It will be noted that the cathode of the limiter tube is positive with respect to ground, said cathode being connected to the B plus source as explained above. Consequently, no current will flow in the diode detecting circuit until the amplitude of the positive peaks of the voltage developed across the tuned circuit is sufficient to overcome this positive cathode voltage. As the frequency of the actuating voltage more closely approaches the intermediate frequency of the receiver a greater voltage will be developed across the tuned circuit, with the result that in a narrow region near resonance of the tuned circuit an alternating voltage is impressed upon the plate of the diode sufficient during its positive peaks to overcome the positive voltage on the cathode of the tube. Consequently, delayed detecting action results, and a direct current flows through the diode load resistor 32, developing a negative voltage at the top of the resistor. This negative voltage is impressed upon the grid of the power tube 35 and is sufficient to bias the power tube to cut-off. In one embodiment of my invention which I have constructed this negative voltage is about 25 volts.

As explained heretofore, when the power tube 35 is biased to cut-off the energizing voltage for the motor circuit is removed, the motor 43 ceases to run, the holding solenoid 43e or 44f as the case may be becomes de-energized and the switch 44 is caused to open.

In order to again complete an automatic tuning operation it is merely necessary to manually close the switch 44, thus completing the motor circuit from the source 38b as earlier described and also grounding the grid of the power tube 35 through the switch element 44b to cause such tube to again become conductive. When this operation is performed the motor 43 immediately starts to run, and by the time the switch element 44b is released to remove the ground connection from the grid of the power tube 35 the motor 43 will have varied the tuning means to such an extent that the frequency of the actuating voltage is no longer within the narrow band to which the tuned circuit is responsive. Consequently, the motor will continue to run and the tuning means will be varied until the tuning very closely approaches the frequency of another received signal. Obviously, if it is desired to tune in the opposite direction it is merely necessary to manually close the switch 44 in the other direction so that the movable element 44*a* comes into engagement with its contact 44*d* and the flexible movable element 44*b* comes into contact with the contact 44*h*. Momentary operation of the control switch will thus be seen to automatically tune the receiver to the next channel (of either higher or lower frequency, as may be desired) where there is a signal above the predetermined level. If this is not the station wanted the control may be successively operated until the desired signal is reached; or the control may be held, causing the tuning to pass right over the channels without stopping, until the desired channel is approached, whereupon release of the manual control causes the tuning automatically to stop at such channel.

In the event that the tuning means are varied until they approach the end of their travel in one direction, the appropriate limit switch 45 or 46 as the case may be will open, thus opening the motor circuit, and it will be possible to tune only in the opposite direction. It will be further seen that in my improved automatic tuning system it is important that the tuned circuit comprising the condenser 29 and the inductance 30 have a high ratio of reactance to circuit resistance (a high Q) in order that such circuit be responsive to only a very narrow band of frequencies on either side of the intermediate frequency of the receiving system. By constructing this circuit with a high Q it is possible to stop the motor when the tuning means are sufficiently accurately coordinated with the received signal.

By varying the position of the movable tap 15*a* of the potentiometer the input voltage to the limiter tube 16 may be controlled and the system may be set so that the motor 43 will be stopped only when signals above a predetermined level have been received, for weaker signals will not provide enough actuating voltage to overcome the diode bias. This is the only adjustment in the system and it may be set at the factory, if desired, to a level such that the tuning system will operate on all signals above an average noise level; or may be set at the time of installation of the set, to meet local conditions.

Referring now to Figure 2, there is illustrated a modified form of automatic tuning circuit, this circuit being adapted to be used in receivers having a discriminator or other means for developing an actuating voltage which varies in amplitude and polarity as a function of the tuning with respect to a received signal or an amplified signal. As illustrated in Figure 2 my modified automatic tuning circuit is shown as operating in cooperation with a motor driven automatic frequency control arrangement of the type shown in Report LB-654, RCA Laboratories. This particular motor driven automatic frequency control circuit is shown only for purposes of illustration, for my improved modified automatic tuning system may be used with other automatic frequency control circuits, as for example, the circuit disclosed in the co-pending application of Charles T. Carroll, Serial No. 736,317, filed March 21, 1947, now abandoned, or with any other circuit which is controlled by an actuating voltage which varies in amplitude and polarity as a function of the tuning with respect to a received signal, such as for example an actuating voltage derived from the output of a discriminator. The automatic tuning system illustrated in Figure 2 is therefore particularly adapated to be used with a frequency modulation receiver, but such system may be used equally well with an amplitude modulation receiver which includes a frequency detector or discriminator.

The automatic frequency control circuit shown in the upper portion of Figure 2 is described in detail in the aforementioned RCA Laboratories license bulletin, and therefore the description of such circuit will be kept brief here. The double triode control tube 100, which may be of tube type No. 6SL7-GT, includes two sections, each containing cathode, grid and plate elements. The grid of one section is coupled to the source of automatic frequency control actuating voltage through the resistor 101, such voltage being obtained from a discriminator, a ratio detector, or other conventional source. The cathodes of the two sections are respectively connected to opposite ends of the potentiometer 102, the movable tap of which leads to ground through the resistor 103 which is bypassed by the condenser 104 and through the resistor 105, and the mid-point between the resistors 103 and 105 is connected to a source of A. C. voltage through the resistor 106. This source of voltage indicated merely by the terminal 107 may be from a 6.3 volt, 60 cycle alternating current supply.

The plates of the respective sections are connected to opposite ends of the primary 108*a* of an audio transformer 108, and the center tap of such primary is connected to the B plus supply. The double triode control tube thus forms two arms of a bridge. When equal pulsating currents flow through each section of the tube, equal and opposite currents flow through each half of the primary 108*a* and cancel to zero. When the bridge is unbalanced the currents are not equal and a difference voltage appears across the primary. A 180° phase displacement in the developed voltage occurs depending upon whether the bridge is unbalanced by a positive or a negative actuating voltage. Thus by displacing this developed voltage an additional 90°, the output voltage will lead or lag the applied voltage by 90°.

The difference voltage above described is impressed upon the grid circuit of the control tube 109, which may be tube type No. 6AG7, by means of the circuit including the transformer secondary 108*b* and the resistor 110. The lower end of the secondary 108*b* is connected to ground and said secondary is bypassed by the condenser 111, which condenser is of such a value that when taken with the other circuit constants an additional 90° phase shift is obtained. The cathode of the control tube is connected to ground through the resistor 112 which is bypassed by the condenser 113, and the output of the control tube is inductively coupled into a motor circuit by means of the transformer 114.

This last named circuit includes the motor 115 which may be a conventional two phase 60 cycle alternating current electric tuning motor of a common type. Two field coils 115*a* and 115*b* of the motor are adapted to be energized from an external source of voltage through the terminals 116, as for example from a 12.6 volt, 60 cycle alternating current source, the circuit of said coils including the limit switches 140 and 141, one switch being associated with each coil.

The other two windings 115c and 115d of the motor are connected in series with the transformed primary 114b in the motor circuit above referred to, said circuit being inductively coupled to the output circuit of the control tube 109. The motor 115 is adapted to vary the tuning means of the receiver and may, if desired, be geared down to drive such tuning means at an appropriate speed.

With such a system as above described an actuating voltage change of about plus or minus 0.15 volt will start the motor. However, once the motor is started it will run with considerably less current than is required to start it so it will drive back much closer to the center frequency, and with such a system when a received signal provides an actuating voltage of approximately 0.15 volt the motor will start and will tune the receiver to the center frequency of this signal, at which time there will no longer be an actuating voltage output from the frequency detector. If at any later time the receiver oscillator or the received signal drifts sufficiently to create an actuating voltage of 0.15 volt or more the motor will start again and correct the tuning.

The modified automatic tuning system shown in the lower portion of Figure 2 is designed to automatically provide a control voltage which may selectively be applied to the input of the control tube 100 in order to cause automatic tuning of the receiver until the amplified signal becomes strong enough to provide the desired automatic frequency control actuating voltage. At this time the control voltage from the automatic tuning system is removed and the automatic frequency control operates in the manner above described to complete the tuning of the receiver.

Whereas the actuating voltage for the automatic tuning system illustrated in Figure 1 varies in frequency as a function of the tuning with respect to a received signal, the actuating voltage for the automatic tuning system shown in the lower portion of Figure 2 varies in amplitude as a function of the strength of an amplified signal. For example, this desired actuating voltage may be obtained from the automatic volume control system or from any other source providing a voltage which varies in amplitude as a function of the strength of a signal which is received and amplifier in the receiver. In Figure 2 it is assumed that the actuating voltage for the automatic tuning system is obtained by tapping off a portion of the automatic volume control voltage to ground through the potentiometer 120. The movable tap 120a of this potentiometer is connected to the control grid of the tube 121, and the setting of this movable tap determines the amplitude point at which the automatic tuning system will function, in the same manner as does the movable tap 15a in Figure 1.

The tube 121 which may be a pentagrid tube of tube type No. 6SA7, comprises a cathode connected to ground through the resistor 122 and bypass condenser 123, a control grid connected with the actuating voltage as hereinabove described, a second grid bypassed to ground by condenser 139 and connected to the B plus supply through the resistor 124, a third grid acting as an oscillator grid in a manner to be hereafter described, a fourth grid connected to said second grid, a fifth grid connected as a suppressor grid to the cathode, and a plate. Plate current normally flows through the tube, and the inductance 125a comprising one element of the transformer 125 couples a portion of the energy from the plate circuit into the circuit of the third or oscillator grid by means of the secondary 125b. This secondary is shunted by the condenser 126 to form a tuned circuit determining the frequency at which the tube will normally oscillate, the lower end of the tuned circuit being connected to ground and the upper end being connected to the third grid through the condenser 127. A resistor 128 is connected between the third grid and ground, and from the top of this resistor a negative control voltage is taken off through the lead 129. Since the cathode is positive with respect to ground, a positive control voltage is taken off the cathode by means of the lead 130. The bypass condenser 131 conducts the A. C. component of the plate current of the tube to ground, and the bypass condenser 132 conducts the pulsations in the negative voltage taken from the oscillator grid to ground. I find it preferable so to proportion the oscillator circuit elements that the oscillator operates at a frequency above audibility but so low that only high order (and therefore weak) harmonics appear within the tuning range of the receiver, and I have found that an oscillator constructed to oscillate at a frequency of 100 kc. or below gives satisfactory results in a conventional receiver.

A normally open switch indicated generally at 133, which operates generally the same as the switch 44 of the Figure 1, includes a movable manual control member comprising the element 133a of magnetic material, this element having a non-conducting manually operable flexible extension 133b, contacts 133c and 133d adapted to cooperate with the element 133a, solenoids 133e and 133f adapted to hold the element 133a in engagement with the respective contacts 133c and 133d, and contacts 133g and 133h each adapted to be closed by the flexible element 133b only when said flexible element is held against one of said contacts by manual pressure. The B plus supply circuit for the tube 121 includes the solenoids 133e and 133f in series so that whenever the tube 121 conducts the solenoids are energized, and whenever the tube 121 is cut off the solenoids become de-energized. The contacts 133g and 133h are connected together and are connected to the control grid of the tube 121. As may be seen in Figure 2, when either of the contacts 133g or 133h is closed the control grid of the tube 121 is grounded, thereby removing from such grid the effect of any bias voltage, and causing the tube 121 to conduct.

The negative control voltage source (the oscillator grid) is connected to the contact 133c by means of the lead 129 which incorporates the resistor 134; the positive voltage source (the cathode of the tube 121) is connected to the contact 133d by means of the lead 130, and the movable member 133a is connected to the input grid of the tube 100 through the lead 135 which incorporates the resistance 136.

In normal operation when the receiver is tuned to a station, the actuating voltage which may be obtained from the automatic volume control system of the receiver maintains the grid of the tube 121 below cut off. In order to operate the automatic tuning system the movable switch member 133 is manually operated so that the element 133a engages one of its cooperating contacts, as for example contact 133c, and the flexible element 133b is manually caused to close the contact 133g. By this action, the control grid of the tube 121 is grounded and such tube starts to conduct. Plate current of the tube energizes the solenoids 133*e* and 133*f*, thus holding the movable element 133*a* into engagement with the contact 133*c* after the manual pressure is removed, and because of the feedback from the plate circuit into the oscillator grid circuit by means of the transformer 125, the tube oscillates, thereby providing a negative control voltage at the contact 133*c* and a positive control voltage at the contact 133*d*. In the example given, the negative control voltage is impressed upon the input of the tube 100, and this control voltage is of sufficient amplitude to override any actuating voltage from the discriminator existing at the input grid of the tube 100, thereby unbalancing the electronic bridge comprising said tube and its associated circuits and causing the motor 115 to run in one direction.

By the time the manual pressure on the switch is removed so that the contact 133*g* opens, the motor 115 has varied the tuning means so that the amplified signal which provides the source of automatic volume control actuating voltage is greatly weakened or has entirely disappeared and is no longer sufficient to cut off tube 121, and the motor will continue to run until a signal is received and amplified to a sufficient extent to cut off this tube. When this occurs, plate current will cease to flow through the tube, the solenoids will become de-energized, and the switch 133 will open. Furthermore, since the tube 121 includes the oscillator from which the control voltage is obtained, this oscillator will cease to function and the control voltage will be destroyed. When the overriding control voltage is removed from the input grid of the tube 100, the weaker actuating voltage now being received from the discriminator will take over to control this tube and complete the tuning operation. Obviously, if it is desired to tune in the opposite direction, it is merely necessary to close the switch 133 in the opposite direction so that it cooperates with contacts 133*d* and 133*h*.

As in the case of the embodiment of my invention illustrated in Figure 1, this last described automatic tuning system may be operated by means of only one control to cover a complete tuning range, its operation being limited only by the sensitivity of the receiving system with which it is used, by the availability of signals, and by the setting of the potentiometer tap 120*a*.

If it is desired to operate my improved automatic tuning system by remote control, a duplicate switch like switch 44 (Fig. 1) or 133 (Fig. 2) with duplicate holding solenoids may be connected at the remote operating point by means of a four or six wire cable; or if control is to be from the remote point only, the switch may be located at such point without any duplicate at the receiver.

In one embodiment of my invention which I have constructed, I have used electrical components of the following values in connection with a conventional radio receiver which covers a standard tuning range: condensers 14 and 17*a*, each 25 microfarads; condensers 19 and 22, each 0.01 microfarad; condenser 33, 0.005 microfarad; and condenser 37, 50 microfarads; potentiometer 15, 1 megohm (maximum value); resistors 17 and 32, 2.2 megohms; resistor 18, 3300 ohms; and resistor 36, 400 ohms. In the automatic frequency control circuit shown in the upper portion of Figure 2, condenser 104, 25 microfarads; condenser 111, 3,000 microfarads; and condenser 113, 50 microfarads; resistor 101, 470,000 ohms; potentiometer 102, 1,000 ohms (maximum value); resistor 103, 2700 ohms; resistor 105, 100 ohms; resistor 106, 570 ohms; and resistor 112, 570 ohms. In the automatic tuning circuit shown in the lower portion of Figure 2, condensers 123 and 131, each 0.05 microfarad; and condenser 132, 0.005 microfarad; potentiometer 120, 2 megohms (maximum value); resistor 122, 470 ohms; resistor 128, 220,000 ohms; resistor 134, 470,000 ohms; and resistor 136, 1.5 megohms.

While I have shown and described certain embodiments of my invention, it is to be understood that it is capable of many modifications. Changes, therefore, in the construction and arrangement may be made without departing from the spirit and scope of the invention as disclosed in the appended claims.

I claim:

1. In a receiving system having variable tuning means and means for developing an actuating voltage having characteristics which vary as a function of the tuning with respect to a received signal, apparatus of the character described, including: motor means adapted to vary said tuning means; circuit means including said motor means and a first normally open switch; a second independently operable normally open switch; control means mechanically interconnecting said switches and operable to close said first and second switches; and electronic means adapted to control an energizing voltage in said circuit and maintain only said first switch closed, said electronic means being coupled to said means for developing an actuating voltage and being operated by said actuating voltage to cause said first switch to open and said energizing voltage to be removed when said receiving system has been tuned to approximate resonance with said received signal.

2. Apparatus of the character claimed in claim 1, wherein said control means are manually operable, and wherein said second switch and said means for developing an actuating voltage are connected in parallel so that closure of said second switch renders said actuating voltage ineffective to operate said electronic means.

3. Apparatus of the character claimed in claim 1, wherein a circuit is provided connecting said means for developing an actuating voltage and said second switch generally in parallel, and wherein said motor means are reversible, and said motor circuit includes at least one limit switch to open the motor circuit at the end of travel of the tuning means.

4. In a radio receiving system having variable tuning means and means for developing an actuating voltage which varies in frequency as a function of the tuning with respect to a received signal, apparatus of the character described, including: first electronic means including means for developing, as a function of only the frequency of said actuating voltage, a control voltage; a motor adapted to vary said tuning means; a circuit including said motor and a first normally open switch; a second independently operable normally open switch control means mechanically interconnecting said switches and operable to close said first and second switches; and second electronic means responsive to said control voltage and adapted to control an energizing voltage in said circuit and maintain only said first switch closed, said second electronic means causing said first switch to open and said energizing voltage to be removed when said receiving system has been tuned to approximate resonance with said received signal.

5. In a radio receiving system having variable tuning means and means for developing an actuating voltage which varies in frequency as a function of the tuning with respect to a received signal, apparatus of the character described, including: first electronic means comprising a tube having an electrode controlled by said actuating voltage, frequency responsive means coupled to the output voltage of said tube, and rectifying means associated with said frequency responsive means for developing, as a function of the frequency of said actuating voltage, a direct current control voltage; a motor adapted to vary said tuning means; a source of power for operating said motor; a circuit adapted to apply said power to said motor, said circuit including a normally open switch; and a second tube having a control electrode responsive to said control voltage and operatively connected to said switch, said second tube causing said switch to open when said receiving system has been tuned to approximate resonance with said received signal.

6. Apparatus of the character claimed in claim 4 wherein said motor is reversible, and said circuit includes at least one limit switch to open the motor circuit at the end of travel of the tuning means.

7. In a radio receiving system having variable tuning means and means for developing an actuating voltage which varies in frequency as a function of the tuning with respect to a received signal, apparatus of the character described, including: first electronic means comprising a limiter tube having a grid controlled by said actuating voltage and an output electrode, a tuned circuit having a high ratio of reactance to circuit resistance and responsive to the voltage on the output electrode of said tube, and detecting means connected to said tuned circuit for developing, as a function of the frequency of said actuating voltage, a direct current control voltage; a motor adapted to vary said tuning means; a source of power for operating said motor; a circuit adapted to apply said power to said motor, said last mentioned circuit including a normally open switch; and a second tube having a grid responsive to said control voltage, said second tube being connected in a circuit to maintain said switch closed, said second tube opening said circuit and causing said switch to open when said receiving system has been tuned to approximate resonance with said received signal.

8. Apparatus of the character claimed in claim 7, wherein said first electronic means includes biasing means operative upon said detecting means for providing delayed detection.

9. In a radio receiving system having variable tuning means and means for delevolping an actuating voltage which varies in amplitude as a function of the strength of an amplified signal, apparatus of the character described, including: a circuit including motor means adapted to vary said tuning means; means for developing a control voltage; means for selectively causing said control voltage to energize said circuit, said last mentioned means including normally open switch means; and electronic means for maintaining said switch means closed, said electronic means being operatively connected to the means for developing an actuating voltage and operated by said actuating voltage to cause said switch means to open when a sufficient signal is received.

10. In a radio receiving system having variable tuning means and means for developing an actuating voltage which varies in amplitude as a function of the strength of an amplified signal, apparatus of the character described, including: a circuit including motor means adapted to vary said tuning means; means for developing a control voltage; means for selectively causing said control voltage to energize said circuit, said last mentioned means including first normally open switch means; second normally open switch means; interconnected control means operable to close said first and second switch means; and electronic means for maintaining only said first switch means closed, said electronic means being operatively connected to the means for developing an actuating voltage and operated by said actuating voltage to cause said first switch means to open when a sufficient signal is received.

11. In a radio receiving system having variable tuning means and means for developing a first actuating voltage which varies in amplitude and polarity as a function of the tuning with respect to a received signal and a second actuating voltage which varies in amplitude as a function of the strength of an amplified signal, apparatus of the character described, including: a circuit including a reversible motor adapted to vary said tuning means; first electronic means adapted to control an energizing voltage in said circuit, said first actuating voltage being adapted to operate said electronic means; means for developing a control voltage of greater amplitude than said first actuating voltage; means for selectively connecting said control voltage to the input to said electronic means, such connecting means including normally open switch means; and second electronic means for maintaining said switch means closed, said second electronic means being adapted to be rendered inoperative by said second actuating voltage to cause said switch means to open when a sufficient signal is received.

12. Apparatus of the character claimed in claim 9 wherein said electronic means include said means for developing a control voltage.

13. In a radio receiving system having variable tuning means and means for developing a first actuating voltage which varies in amplitude and polarity as a function of the tuning with respect to a received signal and a second actuating voltage which varies in amplitude as a function of the strength of an amplified signal, apparatus of the character described, including: a circuit including a reversible motor adapted to vary said tuning means; first electronic means adapted to control an energizing voltage in said circuit, said first actuating voltage being adapted to operate said electronic means; means for developing positive and negative control voltages of greater amplitude than said first actuating voltage; means for selectively connecting said control voltages to the input to said electronic means, such connecting means including first normally open switch means; second normally open switch means adapted when closed to render said second actuating voltage ineffective; interconnected control means operable to close said first and second switch means; and second electronic means for maintaining only said first switch means closed, said second electronic means including said means for developing said control voltage and being adapted to be rendered inoperative by said second actuating voltage to cause said first switch means to open and to destroy said control voltage when a sufficient signal is received.

14. In a radio receiving system having variable tuning means and means for developing a first actuating voltage which varies in amplitude and polarity as a function of the tuning with respect to a received signal and a second actuating voltage which varies in amplitude as a function of the strength of an amplified signal, apparatus of the character described, including: a circuit including a reversible motor adapted to vary said tuning means; first electronic means adapted to control an energizing voltage in said circuit, said first actuating voltage being adapted to operate said electronic means; means for developing negative and positive control voltages of greater amplitude than said first actuating voltage, such means including an oscillator; means for selectively connecting said respective control voltages to the input to said electronic means, such connecting means including first normally open switch means; second normally open switch means adapted when closed to render said second actuating voltage ineffective; manually operable interconnected control means operable to close said first and second switch means; and second electronic means for maintaining only said first switch means closed, said second electronic means including said oscillator and being adapted to be rendered inoperative by said second actuating voltage to cause said first switch means to open and to destroy said control voltages when a sufficient signal is received.

15. Apparatus of the character claimed in claim 9, wherein said circuit includes at least one limit switch in the motor circuit and opening it at the end of travel of the tuning means.

16. In a radio receiving system having variable tuning means and means for developing a first actuating voltage which varies in amplitude and polarity as a function of the tuning with respect to a received signal and a second actuating voltage which varies in amplitude as a function of the strength of an amplified signal, apparatus of the character described, including: a circuit including a reversible motor adapted to vary said tuning means; first electronic means adapted to control an energizing voltage in said circuit to cause said motor to run in one direction when the input to said electronic means is of one polarity, and to cause said motor to run in the opposite direction when said input is of the opposite polarity, said first actuating voltage being adapted to operate said electronic means; means for developing positive and negative control voltages of greater amplitude than said first actuating voltage; means for selectively connecting said control voltages to the input to said electronic means, such connecting means including first normally open switch means; second normally open switch means adapted when closed to render said second actuating voltage ineffective; interconnected control means operable to close said first and second switch means; and second electronic means for maintaining only said first switch means closed, said second electronic means including said means for developing said control voltage and being adapted to be rendered inoperative by said second actuating voltage to cause said first switch means to open and to destroy said control voltage when a sufficient signal is received.

17. In a radio receiving system having variable tuning means and means for developing an actuating voltage which varies in frequency as a function of the tuning with respect to a received signal, apparatus of the character described, including: a limiter tube having at least cathode, plate, and grid elements; adjustable means for applying at least a portion of said actuating voltage to the grid of said tube; a tuned circuit having a high ratio of reactance to circuit resistance and responsive to the output voltage between the plate and cathode of said tube; detecting means operatively connected to said tuned circuit for developing, as a function of the frequency of said output voltage, a direct current control voltage; biasing means operative upon said detecting means for providing delayed detection; a reversible motor adapted to vary said tuning means; a circuit including said motor, at least one normally closed limit switch in the motor circuit and opening it at the end of travel of the tuning means, and a first normally open control switch; a second independently operable normally open switch connected in a circuit generally in parallel with said means for developing an actuating voltage and adapted when closed to render said control voltage ineffective to control said limiter tube; manually operable control means mechanically interconnected to said switches and operable to close said first and second switches; a tube having output elements operatively connected to said motor circuit and having a grid connected to the source of said control voltage to control an energizing voltage in said motor circuit and maintain only said first switch means closed, thereby causing said first switch means to open and said energizing voltage to be removed when said receiving system has been tuned to approximate resonance with said received signal.

NELSON P. CASE.

REFERENCES CITED

The following references are of record in the file of this patent:

UNITED STATES PATENTS

| Number | Name | Date |
|---|---|---|
| 2,011,953 | Somers | Aug. 20, 1935 |
| 2,304,871 | Andrews | Dec. 15, 1942 |
| 2,326,738 | Andrews | Aug. 17, 1943 |
| 2,369,542 | Dietrich | Feb. 13, 1945 |
| 2,375,133 | Polkinghorn | May 1, 1945 |
| 2,394,869 | Nicholson | Feb. 12, 1946 |